US012399229B2

(12) United States Patent
Li

(10) Patent No.: US 12,399,229 B2
(45) Date of Patent: Aug. 26, 2025

(54) BATTERY MANAGEMENT SYSTEM AND POWER SUPPLY DEVICE

(71) Applicant: CONTEMPORARY AMPEREX TECHNOLOGY (HONG KONG) LIMITED, Hong Kong (CN)

(72) Inventor: Jiaying Li, Ningde (CN)

(73) Assignee: CONTEMPORARY AMPEREX TECHNOLOGY (HONG KONG) LIMITED, Hong Kong (CN)

(*) Notice: Subject to any disclaimer, the term of this patent is extended or adjusted under 35 U.S.C. 154(b) by 421 days.

(21) Appl. No.: 17/967,842

(22) Filed: Oct. 17, 2022

(65) Prior Publication Data
US 2023/0204683 A1 Jun. 29, 2023

Related U.S. Application Data

(63) Continuation of application No. PCT/CN2022/094473, filed on May 23, 2022.

(30) Foreign Application Priority Data

Dec. 24, 2021 (CN) .......................... 202111598891.1

(51) Int. Cl.
*G01R 31/396* (2019.01)
*B60L 50/60* (2019.01)
(Continued)

(52) U.S. Cl.
CPC ............ *G01R 31/396* (2019.01); *B60L 50/60* (2019.02); *B60L 58/10* (2019.02); *G01R 31/367* (2019.01);
(Continued)

(58) Field of Classification Search
CPC ..... Y02T 10/70; Y02T 10/7072; Y02T 90/14; Y02T 90/12; Y02T 90/16; Y02T 10/72;
(Continued)

(56) References Cited

U.S. PATENT DOCUMENTS 9,070,908 B2 * 6/2015 Sim .................... H01M 10/482
10,589,630 B2    3/2020 Qian et al.
(Continued)

FOREIGN PATENT DOCUMENTS

CN    102514498 A    6/2012
CN    105843763 A    8/2016
(Continued)

OTHER PUBLICATIONS

International Search Report and Written Opinion, PCT/CN2022/094473, Sep. 7, 2022. 10 pgs.  No Translation Available .
(Continued)

*Primary Examiner* — Mohammad K Islam
(74) *Attorney, Agent, or Firm* — ANOVA LAW GROUP, PLLC

(57) ABSTRACT

This application relates to a battery management system and a power supply device. The battery management system includes a first battery management module and a second battery management module in communication connection with the first battery management module. The second battery management module includes a code detection circuit that includes a plurality of sampling channels. The first battery management module is configured to determine code data based on voltage of at least one of the sampling channels, and perform identity authentication on the second battery management module based on the code data. The code detection circuit is disposed in the second battery management module, and code data is determined based on voltage of the sampling channel in the code detection circuit, so that failure in any battery management module does not affect code data collection by other battery management modules, thus achieving a high management reliability.

15 Claims, 3 Drawing Sheets

(51) Int. Cl.
  *B60L 58/10* (2019.01)
  *G01R 31/367* (2019.01)
  *H01M 10/42* (2006.01)
  *H01M 10/48* (2006.01)

(52) U.S. Cl.
  CPC ....... *H01M 10/425* (2013.01); *H01M 10/482* (2013.01); *H01M 2010/4271* (2013.01); *H01M 2010/4278* (2013.01)

(58) Field of Classification Search
  CPC ......... Y02T 10/62; Y02T 10/64; Y02T 10/92; Y02T 90/167; G01R 31/396; G01R 31/367; B60L 50/60; B60L 58/10; B60L 3/0092; B60L 58/18; B60L 58/21; B60L 3/0084; H01M 10/425; H01M 10/482; H01M 2010/4271; H01M 2010/4278; H01M 10/42; Y02E 60/10; H02J 7/00045; H02J 7/0013; H02J 7/34; H02J 7/00; G06F 11/3075; G06F 8/31; G06F 11/327; G06F 21/45; H04L 2012/40215
  See application file for complete search history.

(56) References Cited

U.S. PATENT DOCUMENTS

| | | | | |
|---|---|---|---|---|
| 2007/0126403 A1* | 6/2007 | Chen | ..................... | H02J 7/0031 320/134 |
| 2011/0080138 A1* | 4/2011 | Nakanishi | ............. | H02J 7/0016 320/116 |
| 2013/0108898 A1 | 5/2013 | Potts et al. | | |
| 2014/0084689 A1* | 3/2014 | Jung | ......................... | H02J 7/34 307/43 |
| 2015/0111076 A1* | 4/2015 | Suzuki | ................. | H02J 7/0014 429/90 |
| 2017/0207637 A1* | 7/2017 | Sugeno | ................ | H02J 7/0013 |
| 2018/0269543 A1* | 9/2018 | Kim | ...................... | H01M 10/46 |
| 2021/0268300 A1* | 9/2021 | Peled | ....................... | A61N 2/02 |
| 2022/0311637 A1* | 9/2022 | Logie | .................. | H01M 10/625 |

FOREIGN PATENT DOCUMENTS

| | | | |
|---|---|---|---|
| CN | 106657427 A | | 5/2017 |
| CN | 106931717 A | | 7/2017 |
| CN | 206579487 U | * | 10/2017 |
| CN | 109004292 A | | 12/2018 |
| CN | 112578699 A | | 3/2021 |
| EP | 2770605 A1 | | 8/2014 |
| JP | 2019215964 A | | 12/2019 |
| JP | 2021185580 A | | 12/2021 |

OTHER PUBLICATIONS

The World Intellectual Property Organization (WIPO) International Search Report and Written opinion for PCT/CN2022/094473 Sep. 7, 2022 11 pages.
The China National Intellectual Property Administration (CNIPA) The First Office Action for Chinese Application 202111598891.1 Jun. 7, 2023 15 Pages (With Translation).
The China National Intellectual Property Administration (CNIPA) The First Office Action for Chinese Application 202111598891.1 Aug. 28, 2023 10 Pages (With Translation).
Ruyin Chen et al., "Communication design between charger and BMS based on event triggering", 2017, Electronic Technology Application Issue 5.
China National Intellectual Property Administration (CNIPA) Office Action 3 for Application No. 202111598891.1 Jan. 26, 2024 17 Pages (including translation).
The European Patent Office (EPO) The Extended European Search Report for U.S. Appl. No. 22785676.2 Dec. 15, 2023 5 Pages.
The Japan Patent Office (JPO) Notification of Reasons for Refusal for Application No. 2022-557161 Feb. 13, 2024 9 Pages(including translation).

* cited by examiner

BATTERY MANAGEMENT SYSTEM AND POWER SUPPLY DEVICE

CROSS-REFERENCE TO RELATED APPLICATIONS

This application is a continuation application of PCT Patent Application No. PCT/CN2022/094473, entitled "BATTERY MANAGEMENT SYSTEM AND POWER SUPPLY DEVICE" filed on May 23, 2022, which claims priority to Chinese Patent Application No. 202111598891.1, filed with the State Intellectual Property Office of the People's Republic of China on Dec. 24, 2021, and entitled "BATTERY MANAGEMENT SYSTEM AND POWER SUPPLY DEVICE", all of which are incorporated herein by reference in their entirety.

TECHNICAL FIELD

This application relates to the field of battery technologies, and in particular, to a battery management system and a power supply device.

BACKGROUND

As a tie between batteries and users, a battery management system (Battery Management System, BMS) mainly manages secondary batteries, with an aim to improve utilization of batteries and prevent battery over-charging and over-discharging, thus extending service life and monitoring states of the batteries. To implement identification between a plurality of BMSs, a conventional method is to use a software-based serial coding scheme. A master control unit transmits a coding signal to a slave control unit. After receiving the coding signal, the slave control unit performs coding and transmits a current code and a coding signal to a next slave control unit. After all slave control units finish coding, a coding complete flag and a current code count are returned to the master control unit. If failure occurs in any slave control unit during the coding, all subsequent slave control units are unable to continue coding, resulting in low management reliability.

SUMMARY

In view of this, it is necessary to provide a battery management system and a power supply device that can improve management reliability.

A battery management system includes:
a first battery management module; and
a second battery management module in communication connection with the first battery management module;
where the second battery management module includes a code detection circuit, and the code detection circuit includes a plurality of sampling channels; and
the first battery management module is configured to determine code data based on voltage of at least one sampling channel in the plurality of sampling channels, and perform identity authentication on the second battery management module based on the code data.

In the foregoing battery management system, the code detection circuit is disposed in the second battery management module, the first battery management module determines code data based on voltage of at least one sampling channel in the plurality of sampling channels, and then the first battery management module performs identity authentication based on the code data of the second battery management module and obtains an authentication result. The code detection circuit is disposed in the second battery management module, and code data is determined based on voltage of the sampling channel in the code detection circuit, so that failure in any battery management module does not affect code data collection by other battery management modules, thus achieving a high management reliability.

In one of the embodiments, the first battery management module is further configured to detect, based on a predefined range, whether the code data of the second battery management module is correct, and output fault prompt information when incorrect code data is detected. Fault prompt information is outputted when incorrect code data is detected, facilitating timely troubleshooting.

In one of the embodiments, the first battery management module is further configured to determine whether a quantity of received code data is consistent with a preset value, and output fault prompt information when the quantity of the received code data is inconsistent with the preset value. Fault prompt information is outputted when the quantity of the received code data is inconsistent with the preset value, further facilitating timely troubleshooting.

In one of the embodiments, the sampling channels of the code detection circuit include a setting channel and an adjustment channel, where the setting channel is configured to be connected to a power terminal or grounded, and the adjustment channel is configured to be connected to the setting channel through a harness or be connected to the setting channel through a voltage divider resistor. The setting channel of the code detection circuit is connected to the power terminal or grounded, the adjustment channel is connected to the setting channel through the harness or voltage divider resistor, and the voltages of the channels are set in such a way that voltages of some channels are fixed and voltages of the remaining channels are adjustable, so that code information of the battery management modules is adjustable.

In one of the embodiments, the second battery management module further includes a battery management unit (Battery Management Unit, BMU for short) low-voltage connector, where the BMU low-voltage connector is connected to a corresponding sampling channel of the code detection circuit. The BMU low-voltage connector is connected to the corresponding sampling channel of the code detection circuit, facilitating voltage setting for channels with voltage unconfigured.

In one of the embodiments, the BMU low-voltage connector is further connected to an external low-voltage connector. In the code detection circuit, the channel with voltage unconfigured is connected to the channel with voltage configured through the external low-voltage connector to perform code configuration for the battery management modules. This can also reduce sizes of the battery management modules.

In one of the embodiments, the first battery management module and the second battery management module perform serial communication. The first battery management module and the second battery management module perform serial communication, facilitating code data transmission and collection between the battery management modules.

In one of the embodiments, the first battery management module and the second battery management module perform serial communication through a controller area network (Controller Area Network, CAN for short) interface, allowing for real-time data communication.

A power supply device includes a battery pack and the foregoing battery management system.

For the foregoing power supply device, a code detection circuit is disposed in a second battery management module, a first battery management module determines code data based on voltage of at least one sampling channel in a plurality of sampling channels, and then the first battery management module performs identity authentication based on the code data of the second battery management module and obtains an authentication result. The code detection circuit is disposed in the second battery management module, and code data is determined based on voltage of the sampling channel in the code detection circuit, so that failure in any battery management module does not affect code data collection by other battery management modules, thus achieving a high management reliability.

In one of the embodiments, all the battery packs are connected in parallel to supply power to an external load. All the battery packs are connected in parallel to supply power to an external load. High-voltage power can be supplied to the external load.

A battery management method, where the method is applied to the foregoing battery management system, and the method includes:

determining, by a first battery management module, code data based on voltage of at least one sampling channel in a plurality of sampling channels, and performing identity authentication on a second battery management module based on the code data. A code detection circuit is disposed in the second battery management module, and the first battery management module determines code data based on voltage of the sampling channel in the code detection circuit, so that failure in any battery management module does not affect code data collection by other battery management modules, thus achieving a high management reliability.

In one of the embodiments, the method further includes:

detecting, by the first battery management module based on a predefined range, whether the code data of the second battery management module is correct, and outputting fault prompt information when incorrect code data is detected. Fault prompt information is outputted when incorrect code data is detected, facilitating timely troubleshooting.

In one of the embodiments, the method further includes:

determining, by the first battery management module, whether a quantity of received code data is consistent with a preset value, and outputting fault prompt information when the quantity of the received code data is inconsistent with the preset value. Fault prompt information is outputted when the quantity of the received code data is inconsistent with the preset value, further facilitating timely troubleshooting.

A battery management apparatus, where the apparatus is applied to the foregoing battery management system, and the apparatus includes: a determining unit, configured to determine code data based on voltage of at least one sampling channel in a plurality of sampling channels; and an authentication unit, configured to perform identity authentication on a second battery management module based on the code data.

For the foregoing battery management apparatus, a code detection circuit is disposed in the second battery management module, and the battery management apparatus determines code data based on voltage of the sampling channel in the code detection circuit, so that failure in any battery management module does not affect code data collection by other battery management modules, thus achieving a high management reliability.

In one of the embodiments, the apparatus further includes:
a detection unit, configured to detect, based on a predefined range, whether the code data of the second battery management module is correct; and
a first prompt unit, configured to output fault prompt information when the detection unit has detected incorrect code data. Fault prompt information is outputted when incorrect code data is detected, facilitating timely troubleshooting.

In one of the embodiments, the apparatus further includes:
a judgment unit, configured to determine whether a quantity of received code data is consistent with a preset value; and
a second prompt unit, configured to output fault prompt information when the judgment unit detects that the quantity of the received code data is inconsistent with the preset value. Fault prompt information is outputted when the quantity of the received code data is inconsistent with the preset value, further facilitating timely troubleshooting.

DESCRIPTION OF EMBODIMENTS

Figure 1:
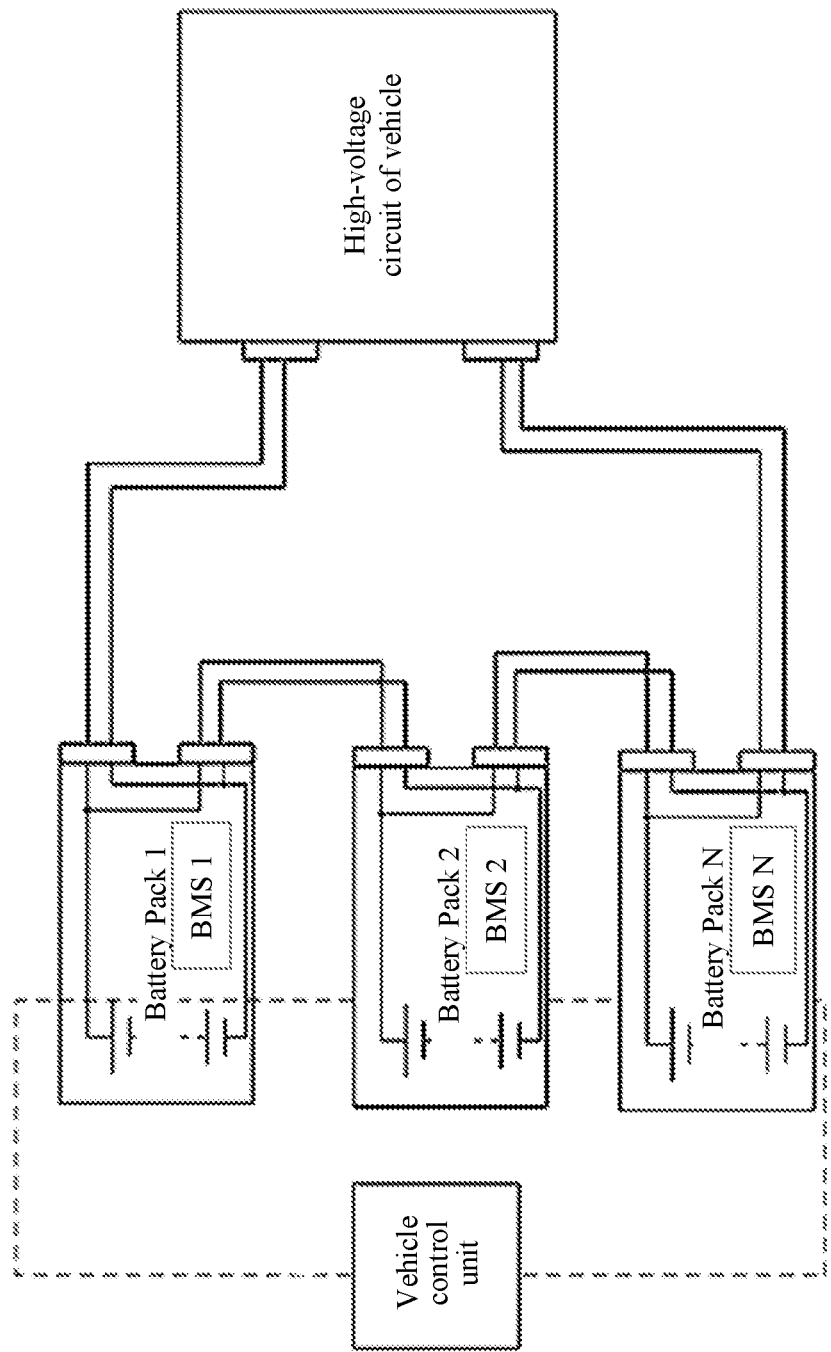
FIG. 1 is a schematic connection diagram of a battery management system according to an embodiment.

To make the objectives, technical solutions, and advantages of this application clearer and more comprehensible, the following further describes this application in detail with reference to the accompanying drawings and embodiments. It should be understood that the specific embodiments described herein are merely used to explain this application but are not intended to limit this application.

Unless otherwise defined, all technical and scientific terms used herein shall have the same meanings as commonly understood by those skilled in the art to which this application belongs. The terms used herein in the specification of this application are only used to describe specific embodiments, and are not intended to limit this application.

It should be noted that when a component is deemed as being "connected to" another component, it may be directly connected to the another component, or may be connected to the another component with a component in between. In the following embodiments, if there are electric signals or data transmission among connected circuits, modules, and units, "connection" should be understood as "electrical connection", "communication connection", and the like.

As used herein, unless otherwise clearly stated in the context, singular forms "a", "an", and "the" can also include plural forms. It should also be noted that, the term "include/contain" or "have" is used to clearly indicate existence of the feature, integer, step, operation, assembly, component, or groups thereof, but does not exclude existence or addition of one or more other features, integers, steps, operations, assemblies, components, or groups thereof. Terms used in this specification include a combination of one or more of the listed items.

As described in Background, a conventional software-based serial coding scheme is used. A master control unit transmits a coding signal to a slave control unit. After receiving the coding signal, the slave control unit performs coding and transmits a current code and a coding signal to a next slave control unit. After all slave control units finish coding, a coding complete flag and a current code count are returned to the master control unit. Serial coding is time-consuming when there are a large number of slave control units. If failure occurs in any slave control unit during the coding, the subsequent slave control units are unable to continue coding.

Currently, a major competitiveness for electric vehicles is their endurance mileages. In order to achieve higher mileages, an increasing number of battery boxes have been provided for electric vehicles. In addition to electric vehicles, electric ships, energy storage systems, and the like are all pursuing more battery boxes to obtain more electricity. As a result, the number of cells is increased sharply, putting the BMU, SPI, and CAN-Bus at risk of being overloaded. Only one BMU can no longer satisfy information processing requirements of a plurality of battery boxes.

Therefore, a master-slave BMS architecture has been developing rapidly. To be specific, in a system, one master BMS performs main control and external interaction, and one slave BMS is configured for each battery pack or each branch in the system for data collection and monitoring, and is also in real-time communication with the master BMS. Such architecture allows a system with a plurality of battery packs as well as each cell to be more controllable.

For such master-slave architecture, identification of a plurality of BMSs is the most important. If the BMSs cannot be identified, a specific faulty battery pack cannot be accurately located. In addition, without identification and related detection, battery packs are at risk of being disconnected unexpectedly, being a default, or even being redundant. Based on this, this solution aims at providing a simple and rapid BMS hardwired code detection and identification solution for a system with a plurality of battery boxes. In the system with a plurality of battery boxes, through different harness connections, a BMS can obtain identities of all battery boxes in an extremely short time (within 100 milliseconds (ms)) after being woken up, and diagnose the connection status of each battery box. Absence or connection failure of any battery box has zero impact on identification and diagnosis of the remaining battery boxes. A fixed harness connection corresponds to a unique identity code. That means, once a code is known, a corresponding battery box can be immediately and accurately located, facilitating troubleshooting and maintenance of battery boxes. In addition to identification of battery boxes, the following identification can also be provided: carrier types, including aircraft, vehicles, ships, and energy storage; and carrier subtypes, for example, a project may involve vehicles of S/M/L types simultaneously.

In an embodiment, a battery management system is provided. A battery may be configured to supply power for vehicle-mounted devices or other devices. For ease of understanding, the following is described by using batteries supplying power for vehicle-mounted devices as an example. As shown in FIG. 1, a battery management system includes a first battery management module and a second battery management module, and the second battery management module is in communication connection with the first battery management module. The second battery management module includes a code detection circuit, and the code detection circuit includes a plurality of sampling channels. The first battery management module is configured to determine code data based on voltage of at least one sampling channel in the plurality of sampling channels, and perform identity authentication on the second battery management module based on the code data.

Both the first battery management module and the second battery management module may be battery management systems (BMS). The first battery management module serves as a master BMS to perform code detection and identity authentication on the second battery management module. The second battery management module may be provided in a quantity of one or more. In addition, the first battery management module may also be provided with a code detection circuit containing a plurality of sampling channels to identify code data of the first battery management module. For ease of understanding, the following descriptions are based on an example that the first battery management module and the second battery management module are BMSs and are both provided with a code detection circuit.

In a system with a plurality of battery boxes, each battery box is correspondingly configured with a battery pack and a BMS. The battery pack may include one or more batteries connected in series, and the BMS is used to manage charging/discharging of the battery pack. The battery pack and the BMS are provided in plurality. For example, as shown in FIG. 1, the battery pack may include Battery Pack 1, Battery Pack 2, . . . , and Battery Pack N, and the BMS may include BMS 1, BMS 2, . . . , and BMS N. The battery packs are connected in parallel to supply power to an external load. Taking a vehicle-mounted power supply as an example, the battery packs are connected in series, then connected to a high-voltage circuit of the vehicle, and output high-voltage power to the vehicle. All the battery packs are connected in parallel to supply power to an external load. High-voltage power can be supplied to the external load. Different BMSs may be connected in series or in a hybrid mode of serial and parallel connection. In this embodiment, the BMSs are in serial communication. The serial communication between the BMSs facilitates transmission and collection of code data between the BMSs. Further, in an embodiment, the BMSs perform serial communication through a CAN interface, allowing for real-time data communication. Moreover, after being connected in series through a CAN interface, all BMSs are further connected to a vehicle control unit (Vehicle Control Unit) for communication.

Specifically, after being woken up, the BMS for each battery box obtains voltage of some or all of the sampling channels in the coding detector circuit, and determines an identity of the battery box based on voltage combinations of the sampling channels. The voltage of each sampling channel in the detection circuit may be set by connecting the sampling channel to a power terminal, a grounding terminal, or a voltage divider resistor. For example, the voltages of all the channels may be set by separately connecting each sampling channel to the power terminal or grounding terminal in the circuit, or by connecting some sampling channels to the grounding terminal or grounding terminal and connecting the remaining sampling channels to the already-set channels.

In an embodiment, the sampling channels of the code detection circuit include a setting channel and an adjustment channel, where the setting channel is configured to be connected to a power terminal or grounded, and the adjustment channel is configured to be connected to the setting channel through a harness or be connected to the setting channel through a voltage divider resistor. The setting channel of the code detection circuit is connected to the power terminal or grounded, the adjustment channel is connected to the setting channel through a harness or voltage divider resistor, and the voltages of the channels are set in such a way that voltages of some channels are fixed and voltages of the remaining channels are adjustable, so that code information of the battery management modules is adjustable.

Figure 2:
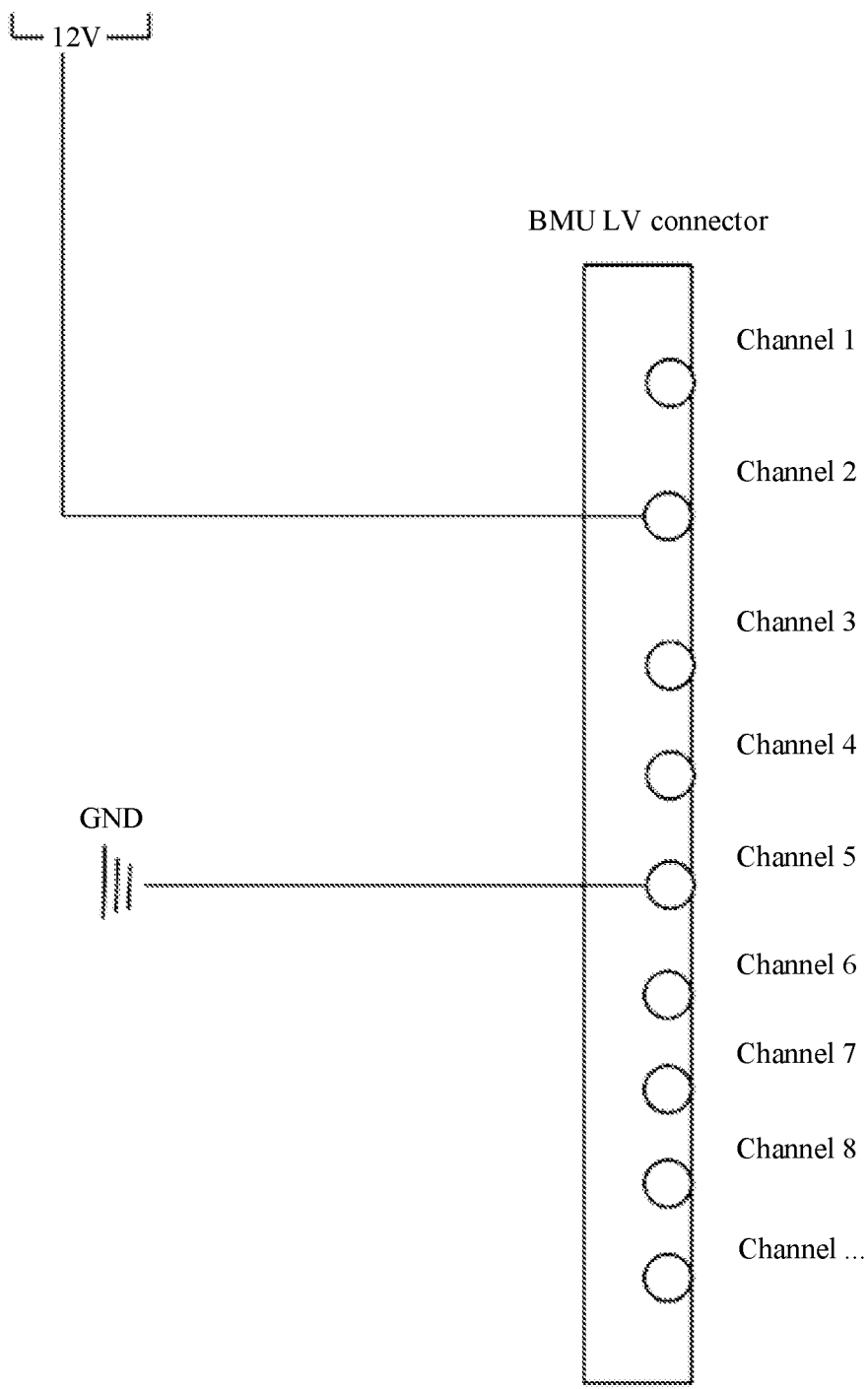
FIG. 2 is a schematic sampling diagram of a BMS containing an internal power supply and a GND according to an embodiment.

Further, in an embodiment, as shown in FIG. 2, the second battery management module further includes a BMU low-voltage connector (BMU LV connector), and the BMU low-voltage connector is connected to a corresponding sampling channel of the code detection circuit. Specifically, the sampling channels include Channel 1, Channel 2, Channel 3, Channel 4, . . . , and Channel N. Channel 1 and Channel 5 may be set as setting channels, and the remaining channels may be used as adjustment channels. The Channel 1 is connected to the power terminal, and specifically, to a 12-volt (V) voltage, and the Channel 5 is grounded. The BMU low-voltage connector is connected to the corresponding sampling channel of the code detection circuit, facilitating voltage setting for channels with voltage unconfigured.

Figure 3:
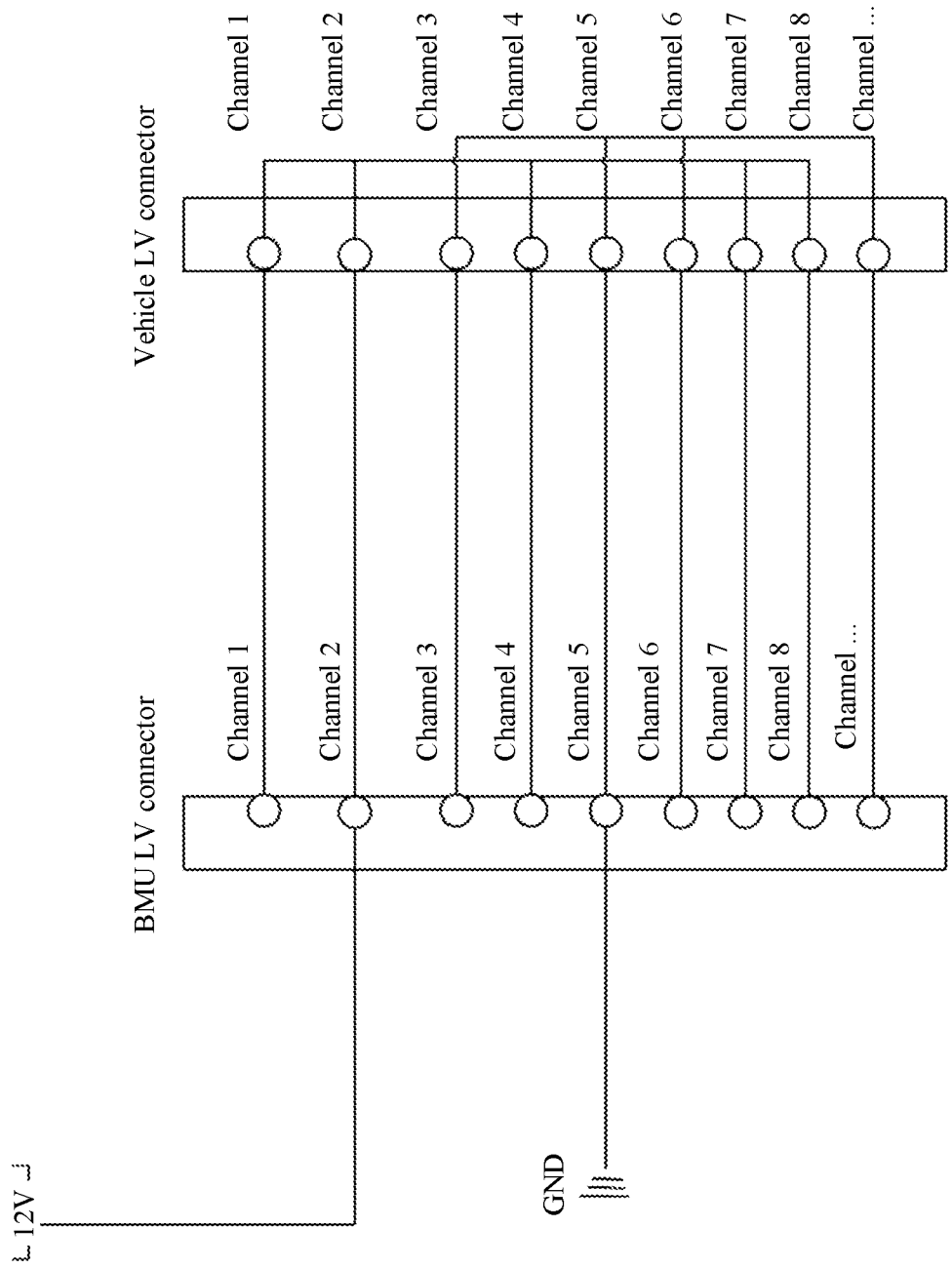
FIG. 3 is a schematic sampling diagram of a BMS connected to a corresponding external harness according to an embodiment.

In addition, in an embodiment, the BMU low-voltage connector is further connected to an external low-voltage connector. In the code detection circuit, the channel with voltage unconfigured is connected to the channel with voltage configured through the external low-voltage connector to perform code configuration for the battery management modules. This can also reduce sizes of the battery management modules. As shown in FIG. 3, using a vehicle-mounted power supply as an example, the external low-voltage connector is a vehicle low-voltage connector (Vehicle LV connector). The remaining sampling channels are separately connected to Channel 1 or Channel 5 by using the vehicle low-voltage connector. Sampling results of the channels may only be 12V high level or 0V low level, and the results are digitalized as 1 for high level or 0 for low level. In this way, the BMS obtains a corresponding voltage from each sampling channel, then the BMS processes the obtained voltage into a digital signal, and thus all the channels can be combined into a unique digital arrangement which gives a unique code identity to a battery box. If the BMS obtains voltage from one sampling channel, one digit obtained by processing is used as code data; and if the BMS obtains voltages from a plurality of sampling channels, a plurality of digits obtained by processing are permutated and combined as code data.

After obtaining the code data of all BMSs, the master BMS performs identity authentication based on the code data to obtain identity information of the corresponding battery box. To be specific, the master BMS may analyze the code data to obtain information such as battery box identities, carrier classes, and carrier types as an authentication result. Finally, the master BMS can further output the obtained authentication result to a vehicle control unit.

In an embodiment, the first battery management module is further configured to detect, based on a predefined range, whether the code data of the second battery management module is correct, and output fault prompt information when incorrect code data is detected. Fault prompt information is outputted when incorrect code data is detected, facilitating timely troubleshooting. Because an identity code of a battery box that is set through combinations of a plurality of channels has been planned in advance, if the code is not within the defined range, a corresponding fault prompt may be reported. For example, fault prompt information is sent to the vehicle control unit to remind that hardware needs to be checked and maintained.

Further, in an embodiment, the first battery management module is further configured to determine whether a quantity of received code data is consistent with a preset value, and output fault prompt information when the quantity of the received code data is inconsistent with the preset value. Fault prompt information is outputted when the quantity of the received code data is inconsistent with the preset value, further facilitating timely troubleshooting. Specifically, with cooperation of the vehicle, for example, through unified diagnostic services (Unified Diagnostic Services, UDS for short), the specified battery box quantity may be inputted when the vehicle is not operating. Then the master BMS may compare the battery box quantity obtained in real time with the preset value. If they are inconsistent, the master BMS may output fault prompt information to the vehicle control unit, reminding, through a fault alarm, to check the battery boxes and communication of the vehicle.

In the foregoing battery management system, the code detection circuit is disposed in the second battery management module, the first battery management module determines code data based on voltage of at least one sampling channel in the plurality of sampling channels, and then the first battery management module performs identity authentication based on the code data of the second battery management module and obtains an authentication result. The code detection circuit is disposed in the second battery management module, and code data is determined based on voltage of the sampling channel in the code detection circuit, so that failure in any battery management module does not affect code data collection by other battery management modules, thus achieving a high management reliability.

In an embodiment, a power supply device is further provided, including a battery pack and the foregoing battery management system. All battery packs are connected in parallel to supply power to an external load. All the battery packs are connected in parallel to supply power to the external load. High-voltage power can be supplied to the external load.

Specifically, the battery management system includes a first battery management module and a second battery management module, and the second battery management module is in communication connection with the first battery management module. The second battery management module includes a code detection circuit, and the code detection circuit includes a plurality of sampling channels. The first battery management module is configured to determine code data based on voltage of at least one sampling channel in the plurality of sampling channels, and perform identity authentication on the second battery management module based on the code data.

In an embodiment, the sampling channels of the code detection circuit include a setting channel and an adjustment channel, where the setting channel is configured to be connected to a power terminal or grounded, and the adjustment channel is configured to be connected to the setting channel through a harness, or be connected to the setting channel through a voltage divider resistor. The setting channel of the code detection circuit is connected to the power terminal or grounded, the adjustment channel is connected to the setting channel through a harness or voltage divider resistor, and the voltages of the channels are set in such a way that voltages of some channels are fixed and voltages of the remaining channels are adjustable, so that code information of the battery management modules is adjustable.

Further, in an embodiment, the second battery management module further includes a BMU low-voltage connector, and the BMU low-voltage connector is connected to a corresponding sampling channel of the code detection circuit. The BMU low-voltage connector is connected to the corresponding sampling channel of the code detection circuit, facilitating voltage setting for channels with voltage unconfigured.

In addition, in an embodiment, the BMU low-voltage connector is further connected to an external low-voltage connector. In the code detection circuit, the channel with voltage unconfigured is connected to the channel with voltage configured through the external low-voltage connector to perform code configuration for the battery management modules. This can also reduce sizes of the battery management modules.

In an embodiment, the first battery management module is further configured to detect, based on a predefined range, whether the code data of the second battery management module is correct, and output fault prompt information when incorrect code data is detected. Fault prompt information is outputted when incorrect code data is detected, facilitating timely troubleshooting.

Further, in an embodiment, the first battery management module is further configured to determine whether a quantity of received code data is consistent with a preset value, and output fault prompt information when the quantity of the received code data is inconsistent with the preset value. Fault prompt information is outputted when the quantity of the received code data is inconsistent with the preset value, further facilitating timely troubleshooting.

For the foregoing power supply device, the code detection circuit is disposed in the second battery management module, the first battery management module determines code data based on voltage of at least one sampling channel in the plurality of sampling channels, and then the first battery management module performs identity authentication based on the code data of the second battery management module and obtains an authentication result. The code detection circuit is disposed in the second battery management module, and code data is determined based on voltage of the sampling channel in the code detection circuit, so that failure in any battery management module does not affect code data collection by other battery management modules, thus achieving a high management reliability.

For better understanding of the foregoing battery management system and power supply device, the following provides detail with reference to specific embodiments.

In the BMS code detection and identification solution according to this application, the BMS performs voltage sampling through a harness to perform coding and diagnosis on each battery box. A unique identity code of each battery box comes from the unique combination of sampled values obtained from a plurality of sampling channels. A fixed harness arrangement provides a fixed sampling result, so that a code of a battery box is also fixed. No matter whether the battery boxes are connected in series or parallel, disconnection or communication failure of any battery box will not affect use of the remaining battery boxes.

Specifically, FIG. 1 shows a simple connection between multi-branch (master/slave) battery boxes and the vehicle. The battery packs are connected in parallel to provide high voltage and perform serial communication through a CAN interface. Based on the foregoing architecture, a battery box coding scheme used in this application is that a BMS in each battery box is provided with a code detection circuit. Such circuit includes N sampling channels, a preset pull-up power channel, a preset pull-down grounding channel, and a voltage divider resistor that can be additionally added to each channel.

FIG. 2 shows a simplified internal circuit scheme. The BMS is directly designed with a built-in 12V pull-up power supply in a sampling circuit corresponding to fixed Channel 2, and therefore voltage that can be collected from such sampling Channel 2 has been fixed as 12V (without considering any loss and accuracy). Similarly, the BMS is designed with a built-in pull-down grounding point in the sampling circuit corresponding to Channel 5, and therefore the voltage of Channel 5 has been fixed as 0V. Next, different channels are connected directly through an external harness or connected through a voltage divider resistor. In this way, the BMS can collect a corresponding voltage from each sampling channel. Then the BMS processes the collected voltage into a digital signal, and the digits collected from all channels can be combined into a unique digital arrangement which gives the battery box a unique code identity.

External harnesses are used to help define and distinguish between the unique code identities of the battery boxes, so that one battery pack corresponds to one BMS, thereby facilitating production management and after-sales services. In the solution based on such architecture, disconnection of any battery box will not affect communication or functionality.

FIG. 3 shows a simplified matching design of external harnesses. According to the solution in FIG. 3, without considering voltage drop, power loss, and the like, the sampling result of each channel can only be 12V high level or 0V low level. Therefore, the result is digitalized as 1 for high level and 0 for low level. The meanings of the channels are defined according to different requirements, for example:
 1. Channel 1: Carrier—0: Car; 1: Ship
 2. Channel 2: Type—0: BEV; 1: PHEV
 3. Channel 3: Type—0: Car; 1: Bus
 4. Channel 4: Car/ship specification—0: S; 1: M
 5. Multi-channel combination: Identity code—Battery box 1/2/3 . . .

For example, assuming that Channels 5-8 represent battery box codes, Channel 5 has been fixed as 0 according to the solution shown in FIG. 1. Channels 6-8 may still be 0 or 1. Then these four channels may be arranged based on combinations of the digits 0/1 as follows and each combination can be defined as a unique identity of a battery box:
 0000—Battery box 1
 0001—Battery box 2
 0011—Battery box 3
 0100—Battery box 4
 0101—Battery box 5
 0110—Battery box 6
 0111—Battery box 7

Therefore, this solution allows use of totally consistent battery boxes that are offered unique identities simply by using different harnesses, thereby facilitating production management and after-sales services. This solution can also be used jointly with the vehicle to detect battery box codes. If the detection result is abnormal, a failure alarm is reported, thereby achieving a fool-proofing effect.

Based on the above solution, the identity code of the battery box that is specified through multi-channel combination may be planned in advance. Therefore, if the code is not within a defined range, corresponding failure is reported to remind that hardware needs to be checked and maintained.

Additionally, with cooperation of the vehicle, for example, the UDS inputs a specified battery box quantity when the vehicle is not operating, then the master BMS can compare a battery box quantity collected in real time with the preset value. If they are inconsistent, a fault alarm is reported to remind the vehicle to check the battery boxes and communication.

There are only two possibilities for each channel in the foregoing solution. To reduce the number of channels by increasing the possibility of each channel, a resistor may be added on the harness side or the BMS side. In this way, voltage division implemented through different resistor combinations can increase gradients of voltage obtained from each channel, beyond the limitation of only 0 or 1.

In an embodiment, a battery management method is further provided. The method is applied to the battery management system in the foregoing embodiment. The method includes:

determining, by a first battery management module, code data based on voltage of at least one sampling channel in a plurality of sampling channels, and performing identity authentication on a second battery management module based on the code data.

Further, in an embodiment, the method further includes:

detecting, by the first battery management module based on a predefined range, whether the code data of the second battery management module is correct, and outputting fault prompt information when incorrect code data is detected.

Further, in an embodiment, the method further includes:

determining, by the first battery management module, whether a quantity of received code data is consistent with a preset value, and outputting fault prompt information when the quantity of the received code data is inconsistent with the preset value.

For specific limitations on the battery management method, reference may be made to relevant content of the foregoing battery management system embodiments of this application. Details are not described herein again.

In an embodiment, a battery management apparatus is further provided, where the apparatus is applied to the battery management system described in the foregoing embodiments. The apparatus includes:

a determining unit, configured to determine code data based on voltage of at least one sampling channel in a plurality of sampling channels; and an authentication unit, configured to perform identity authentication on a second battery management module based on the code data.

Further, in an embodiment, the apparatus further includes:

a detection unit, configured to detect, based on a predefined range, whether the code data of the second battery management module is correct; and a first prompt unit, configured to output fault prompt information when the detection unit has detected incorrect code data.

Further, in an embodiment, the apparatus further includes:

a judgment unit, configured to determine whether a quantity of received code data is consistent with a preset value; and a second prompt unit, configured to output fault prompt information when the judgment unit detects that the quantity of the received code data is inconsistent with the preset value.

For specific limitations on the battery management apparatus, reference may be made to relevant content of the foregoing battery management system embodiments of this application. Details are not described herein again.

Technical features in the foregoing embodiments may be combined in any way. For brevity of description, possible combinations of the technical features in the foregoing embodiments are not described all. However, as long as there is no contradiction among combinations of these technical features, all the combinations should be considered within a range recorded in this specification.

The foregoing embodiments only represent several implementations of this application, and descriptions thereof are specific and detailed, but should not be construed as a limitation on the scope of this patent. It should be noted that those of ordinary skill in the art may further make several modifications and improvements without departing from the concept of this application, and these modifications and improvements also fall within the protection scope of this application. Therefore, the protection scope of this application should be subject to the appended claims.

What is claimed is:

1. A battery management system, comprising:
a first battery management module; and
a second battery management module in communication connection with the first battery management module; wherein
the second battery management module comprises a code detection circuit, and the code detection circuit comprises a plurality of sampling channels; and
the first battery management module is configured to determine a digital signal based on voltage of at least one sampling channel in the plurality of sampling channels, determine code data based on permuting and combining a plurality of digits associated with the digital signal, and perform identity authentication on the second battery management module based on the code data,
wherein the sampling channels of the code detection circuit comprise a setting channel and an adjustment channel, wherein the setting channel is configured to be connected to a power terminal or grounded, and the adjustment channel is configured to be connected to the setting channel through a harness, or be connected to the setting channel through a voltage divider resistor.

2. The battery management system according to claim 1, wherein the first battery management module is further configured to detect, based on a predefined range, whether the code data of the second battery management module is correct, and output fault prompt information when incorrect code data is detected.

3. The battery management system according to claim 1, wherein the first battery management module is further configured to determine whether a quantity of received code data is consistent with a preset value, and output fault prompt information when the quantity of the received code data is inconsistent with the preset value.

4. The battery management system according to claim 1, wherein the second battery management module further comprises a BMU low-voltage connector, wherein the BMU low-voltage connector is connected to a corresponding sampling channel of the code detection circuit.

5. The battery management system according to claim 4, wherein the BMU low-voltage connector is further connected to an external low-voltage connector.

6. The battery management system according to claim 1, wherein the first battery management module and the second battery management module perform serial communication.

7. The battery management system according to claim 6, wherein the first battery management module and the second battery management module perform serial communication through a CAN interface.

8. A power supply device, comprising battery packs and the battery management system according to claim 1.

9. The power supply device according to claim 8, wherein all the battery packs are connected in parallel to supply power to an external load.

10. A battery management method, wherein the method is applied to the battery management system according to claim 1, and the method comprises:
   determining, by a first battery management module, code data based on voltage of at least one sampling channel in a plurality of sampling channels; and
   performing identity authentication on a second battery management module based on the code data.

11. The method according to claim 10, wherein the method further comprises:
   detecting, by the first battery management module based on a predefined range, whether the code data of the second battery management module is correct, and outputting fault prompt information when incorrect code data is detected.

12. The method according to claim 10, wherein the method further comprises:
   determining, by the first battery management module, whether a quantity of received code data is consistent with a preset value, and outputting fault prompt information when the quantity of the received code data is inconsistent with the preset value.

13. A battery management apparatus, wherein the apparatus is applied to the battery management system according to claim 1, and the apparatus comprises:
   a determining unit, configured to determine code data based on voltage of at least one sampling channel in a plurality of sampling channels; and
   an authentication unit, configured to perform identity authentication on a second battery management module based on the code data.

14. The apparatus according to claim 13, wherein the apparatus further comprises:
   a detection unit, configured to detect, based on a predefined range, whether the code data of the second battery management module is correct; and
   a first prompt unit, configured to output fault prompt information when the detection unit has detected incorrect code data.

15. The apparatus according to claim 13, wherein the apparatus further comprises:
   a judgment unit, configured to determine whether a quantity of received code data is consistent with a preset value; and
   a second prompt unit, configured to output fault prompt information when the judgment unit detects that the quantity of the received code data is inconsistent with the preset value.

\* \* \* \* \*